(12) United States Patent
Yueh et al.

(10) Patent No.: US 10,481,709 B2
(45) Date of Patent: Nov. 19, 2019

(54) ELECTRONIC DEVICE

(71) Applicants: Jui-Jen Yueh, Miao-Li County (TW); Chung-Wen Yen, Miao-Li County (TW); Chao-Hsiang Wang, Miao-Li County (TW)

(72) Inventors: Jui-Jen Yueh, Miao-Li County (TW); Chung-Wen Yen, Miao-Li County (TW); Chao-Hsiang Wang, Miao-Li County (TW)

(*) Notice: Subject to any disclaimer, the term of this patent is extended or adjusted under 35 U.S.C. 154(b) by 86 days.

(21) Appl. No.: 15/795,200

(22) Filed: Oct. 26, 2017

(65) Prior Publication Data

US 2018/0120968 A1    May 3, 2018

(30) Foreign Application Priority Data

Nov. 3, 2016  (CN) .......................... 2016 1 0957394
Aug. 1, 2017  (CN) .......................... 2017 1 0647791

(51) Int. Cl.
| | |
|---|---|
| *G06F 3/041* | (2006.01) |
| *H05K 3/40* | (2006.01) |
| *H05K 1/02* | (2006.01) |
| *H05K 1/11* | (2006.01) |
| *H05K 3/24* | (2006.01) |

(52) U.S. Cl.
CPC ............ *G06F 3/041* (2013.01); *G06F 3/0416* (2013.01); *H05K 1/0271* (2013.01); *H05K 1/116* (2013.01); *H05K 3/4053* (2013.01); *G06F 2203/04103* (2013.01); *H05K 1/0281* (2013.01); *H05K 1/115* (2013.01); *H05K 3/245* (2013.01); *H05K 2201/09409* (2013.01); *H05K 2201/09727* (2013.01); *H05K 2201/09745* (2013.01); *H05K 2201/09781* (2013.01); *H05K 2201/10128* (2013.01)

(58) Field of Classification Search
CPC ................... G06F 3/041; G06F 3/0416; G06F 2203/04103; H05K 1/11; H05K 3/40; H05K 3/4053; H05K 2201/09727; H05K 2201/09781

See application file for complete search history.

(56) References Cited

U.S. PATENT DOCUMENTS

| | | | | |
|---|---|---|---|---|
| 10,121,838 | B2* | 11/2018 | Shim ...................... | H01L 27/322 |
| 2003/0168969 | A1* | 9/2003 | Tanabe ................ | H01L 27/3251 |
| | | | | 313/500 |
| 2005/0164527 | A1* | 7/2005 | Radza .................... | H01L 24/72 |
| | | | | 439/66 |
| 2007/0002521 | A1* | 1/2007 | Kimura .................... | H01C 1/14 |
| | | | | 361/306.3 |

(Continued)

*Primary Examiner* — Joe H Cheng
(74) *Attorney, Agent, or Firm* — McClure, Qualey & Rodack, LLP

(57) ABSTRACT

An electronic device is provided. The electronic device includes a substrate, a first contacting element, a second contacting element and a connecting element. The substrate has a first surface and a second surface. The substrate has a through hole located between the first surface and the second surface. At least a part of the connecting element is disposed in the through hole. The first contacting element is disposed on the first surface. The second contacting element is disposed on the second surface. The first contacting element electrically connects the second contacting element through the connecting element.

15 Claims, 8 Drawing Sheets

(56) References Cited

U.S. PATENT DOCUMENTS

| | | | | |
|---|---|---|---|---|
| 2008/0088024 A1* | 4/2008 | Abe | .................. | H01L 23/485 |
| | | | | 257/758 |
| 2011/0316810 A1* | 12/2011 | Tsujino | ............... | G02F 1/13338 |
| | | | | 345/174 |
| 2012/0169682 A1* | 7/2012 | Kuhlman | ............ | H01L 27/3248 |
| | | | | 345/205 |
| 2013/0056769 A1* | 3/2013 | Chen | ................. | H01R 13/6485 |
| | | | | 257/91 |
| 2015/0325630 A1* | 11/2015 | Yoo | .................... | H01L 27/3251 |
| | | | | 257/40 |
| 2018/0031938 A1* | 2/2018 | Watanabe | ......... | G02F 1/136286 |
| 2019/0004359 A1* | 1/2019 | Yueh | ................ | H01L 23/49827 |

\* cited by examiner

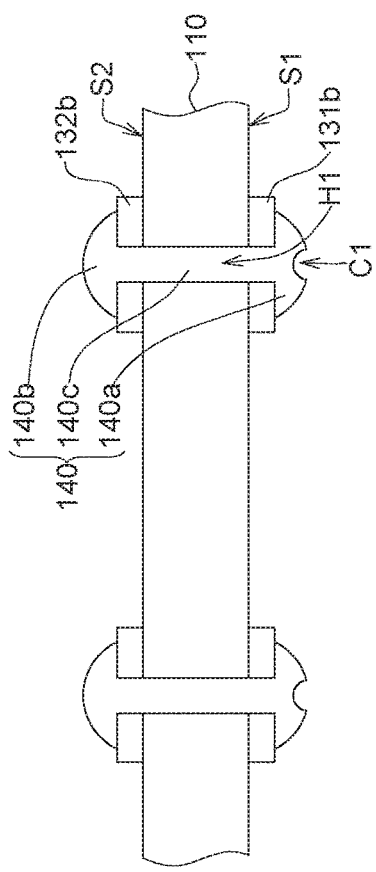
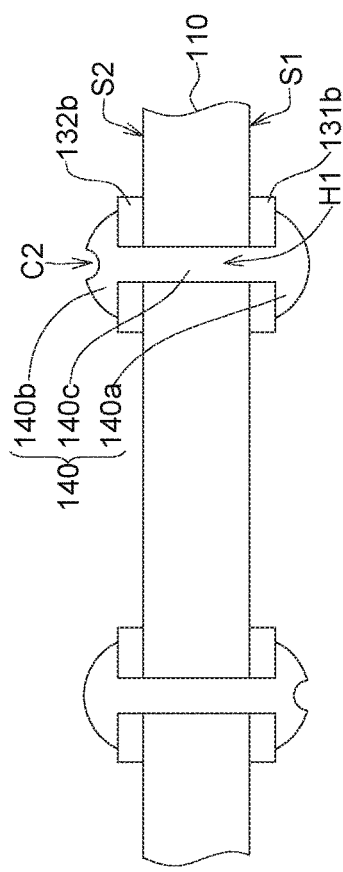
FIG. 4A
FIG. 4B

ELECTRONIC DEVICE

This application claims the benefit of People's Republic of China application Serial No. 201610957394.9, filed Nov. 3, 2016, and the benefit of People's Republic of China application Serial No. 201710647791.0, filed Aug. 1, 2017, the subject matters of which are incorporated herein by reference.

BACKGROUND

Technical Field

The disclosure relates in general to an electronic device, and more particularly to an electronic device having double-sided circuit structure.

Description of the Related Art

Along with the development of technology, a panel is invented. The panel may be a display panel or a touch panel. The touch panel provides the user an intuitive operating interface. Therefore, the touch panel is widely used in electronic devices.

The display panel and the touch panel can be used in tablets, smartphones or smart watches. Usually, the circuit structure of the display panel and the touch panel are complex. Some of the circuits or elements are manufactured by exposure/development technology, and some of the circuits or elements are manufactured by screen printing technology.

SUMMARY

According to a first aspect of the present disclosure, an electronic device is provided. The electronic device includes a substrate, a first contacting element, a second contacting element and a connecting element. The substrate has a first surface and a second surface opposite to the first surface. The substrate has a through hole which communicates the first surface and the second surface. At least a part of the connecting element is disposed in the through hole. The first contacting element is disposed on the first surface. The second contacting element is disposed on the second surface. The first contacting element electrically connects the second contacting element through the connecting element. The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIG. 4A shows a cross section along with the section line A-B of FIGS. 3A and 3B.

FIG. 4B shows another embodiment of a cross section along with the section line A-B of FIGS. 3A and 3B.

DETAILED DESCRIPTION OF THE DISCLOSURE

In the disclosure, a first element "disposed on" or "contact" a second element may refer to the first element is directly or indirectly "disposed on" or "contact" the second element.

In the disclosure, one technical feature in one embodiment can be combined, mixed, or substituted with another technical feature in another embodiment.

Please refer to FIGS. 1A to 1G. FIGS. 1A to 1G show a substrate 910 having a through hole H9 according to several embodiments. The through hole H9 penetrates the substrate 910 and is located between the two opposite surfaces 910s. And the two opposite surfaces 910s can be a first surface and a second surface. In other words, two ends of the through hole H9 are respectively located on the first surface and the second surface. In the substrate 910 of the electronic device, the connecting element 940a to 940g in the through hole 9H is used to connect the circuits on the double sides. And at least a part of the connecting element 940a to 940g is disposed in the through hole 9H. For example, the substrate 910 may be a flexible substrate or a rigid substrate. The material of the flexible substrate may be Polyimide (PI), Polyethylene Terephthalate (PET) or Poly Carbonate (PC). The material of the rigid substrate may be glass, ceramic, quartz, sapphire, etc. The through hole H9 can be formed by mechanical drilling, laser drilling or chemical etching. The material of the connecting element 940a to 940g may be metal glue, metal paste, solder paste, or any suitable conductive material.

Figure 1A:
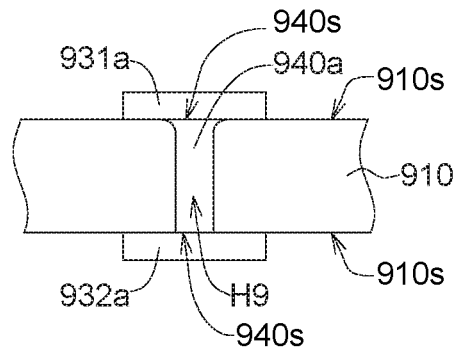
FIGS. 1A to 1G show a substrate having a through hole according to several embodiments.

As shown in FIG. 1A, the surface 940s of the connecting element 940a disposed in the through hole H9 is substantially aligned with the surface 910s of the substrate 910. In the disclosure, a surface being aligned with another surface means the two surfaces are substantially in a same plane. The through hole H9 penetrating the substrate 910 is formed firstly, and the connecting element 940a is formed in the through hole H9. Then, the contacting elements 931a, 932a are formed by coat/exposure/development or screen printing. The contacting elements 931a, 932a are respectively disposed on the two opposite surfaces 910s. The contacting elements 931a, 932a flatly dispose on the surface 940s of the connecting element 940a and the surface 910s of the substrate 910. Therefore, the contacting element 931a electrically connects the contacting element 932a through the connecting element 940a. In the embodiment described below, the material of the contacting elements 931a, 932a may be gold, silver, copper, nickel, tin, any suitable conductive material, or the combination thereof. The contacting element 931a, 932a may be conductive pads, conductive traces or conductive paste. Moreover, the step of forming the through hole H9 in the substrate 910 and the step of forming the connecting element 940a in the through hole H9 can be performed sequentially or at the same time. In some embodiment, the contacting elements 931a, 932a contact the surfaces 940s of the connecting element 940a.

Figure 1B:
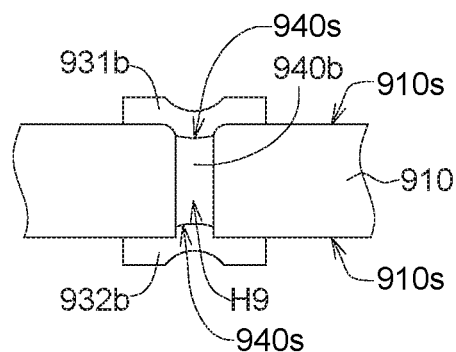
Figure 1C:
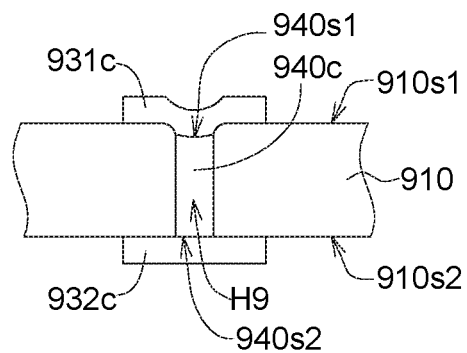

As shown in FIG. 1B, in another embodiment, the surface 940s of the connecting element 940b is located within the through hole H9, such that the connecting element 940b will not protrude from the surface 910s of the substrate 910 and can be prevented from scratching. The through hole H9 penetrating the substrate 910 is formed firstly, and the connecting element 940b is formed in the through hole H9. Then, the contacting elements 931b, 932b are formed by coat/exposure/development or screen printing. The contacting elements 931b, 932b inwardly dispose on the surface 940s of the connecting element 940b. In some embodiment, the contacting elements 931b, 932b contact the surfaces 940s of the connecting element 940b.

As shown in FIG. 10, in another embodiment, the surface 940s1 which can be the third surface of the connecting element 940c is located within the through hole H9, and the surface 940s2 which can be the fourth surface of the connecting element 940c is aligned with the second surface 910s2 of the substrate 910. The through hole H9 penetrating the substrate 910 is formed firstly, and the connecting element 940c is formed in the through hole H9. Then, the contacting elements 931c, 932c are formed by coat/exposure/development or screen printing. The first contacting element 931c inwardly disposes on the surface 940s1 of the connecting element 940c and disposes on the first surface 910s1 of the substrate 910. The second contacting element 932c flatly disposes on the surface 940s2 of the connecting element 940c, and disposes on the second surface 910s2 of the substrate 910. In some embodiment, the contacting elements 931c, 932c contact the surfaces 940s1, 940s2 of the connecting element 940c.

Figure 1D:
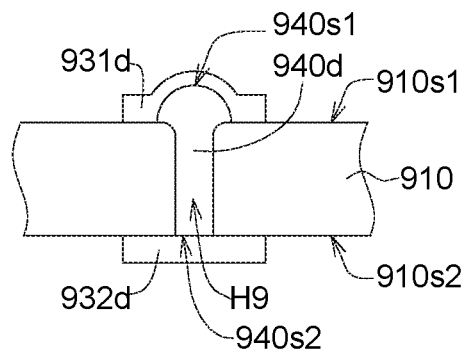

As shown in FIG. 1D, in another embodiment, the surface 940s1 protrudes from the through hole H9. In other words, the surface 940s1 which can be the third surface of the connecting element 940d protrudes from the first surface 910s1 of the substrate 910, and the surface 940s2 which can be the fourth surface of the connecting element 940d is substantially aligned with the second surface 910s2 of the substrate 910. The through hole H9 penetrating the substrate 910 is formed firstly, and the connecting element 940d is formed in the through hole H9. Then, the contacting elements 931d, 932d are formed by coat/exposure/development or screen printing. The first contacting element 931d outwardly disposes on the surface 940s1 of the connecting element 940d, and disposes on the first surface 910s1 of the substrate 910. The second contacting element 932d flatly disposes on the surface 940s2 of the connecting element 940d, and disposes on the second surface 910s2 of the substrate 910. In some embodiment, the contacting elements 931d, 932d contact the surfaces 940s1, 940s2 of the connecting element 940d.

Figure 1E:
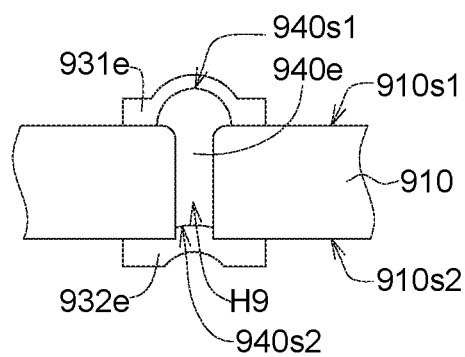

As shown in FIG. 1E, in another embodiment, the surface 940s1 of the connecting element 940e protrudes from the through hole H9. In other words, the surface 940s1 which can be the third surface of the connecting element 940e protrudes from the first surface 910s1 of the substrate 910, and the surface 940s2 which can be the fourth surface of the connecting element 940e is located within the through hole H9. The through hole H9 penetrating the substrate 910 is formed firstly, and the connecting element 940e is formed in the through hole H9. Then, the contacting elements 931e, 932e are formed by coat/exposure/development or screen printing. The first contacting element 931e outwardly disposes on the surface 940s1 of the connecting element 940e, and disposes on the first surface 910s1 of the substrate 910. The second contacting element 932e inwardly disposes on the surface 940s2 of the connecting element 940e, and disposes on the second surface 910s2 of the substrate 910. In some embodiment, the contacting elements 931e, 932e contact the surfaces 940s1, 940s2 of the connecting element 940e.

Figure 1F:
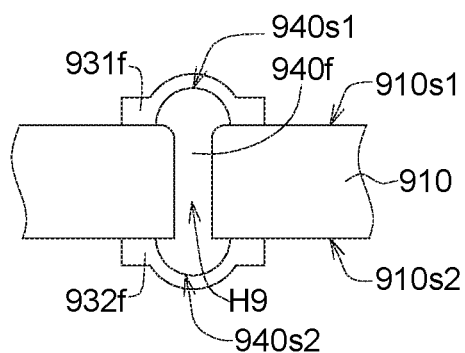

As shown in FIG. 1F, in another embodiment, the two surfaces 940s1, 940s2 of the connecting element 940f protrudes from the through hole H9. In other words, the surface 940s1 which can be the third surface of the connecting element 940f and the surface 940s2 which can be the fourth surface of the connecting element 940f protrude from the first surface 910s1 and the second surface 910s2 of the substrate 910. The through hole H9 penetrating the substrate 910 is formed firstly, and the connecting element 940f is formed in the through hole H9. Then, the contacting elements 931f, 932f are formed by coat/exposure/development or screen printing. The first contacting element 931f and the second element 932f outwardly dispose on the surfaces 940s1, 940s2 of the connecting element 940f, and dispose on the first surface 910s1 and the second surface 910s2 of the substrate 910. In some embodiment, the contacting elements 931f, 932f contact the surfaces 940s1, 940s2 of the connecting element 940f.

Figure 1G:
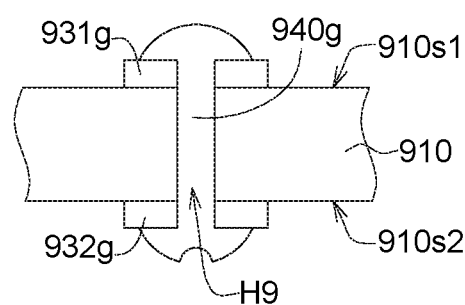

As shown in FIG. 1G. in another embodiment, the contacting elements 931g, 932g are formed on the substrate 910 firstly, and then the through hole H9 penetrating the contacting element 931g, the substrate 910 and the contacting element 932g. Then, the conductive material, such as silver paste, is filled in the through hole H9 to form the connecting element 940g, such that part of the connecting element 940g disposes on the contacting elements 931g, 932g. In some embodiment, part of the connecting element 940g contacts the contacting elements 931g, 932g.

The following embodiments are illustrated by taking the structure shown in FIG. 1G as examples. However, the structures shown in FIGS. 1A to 1G can be used in the following embodiments.

Figure 2A:
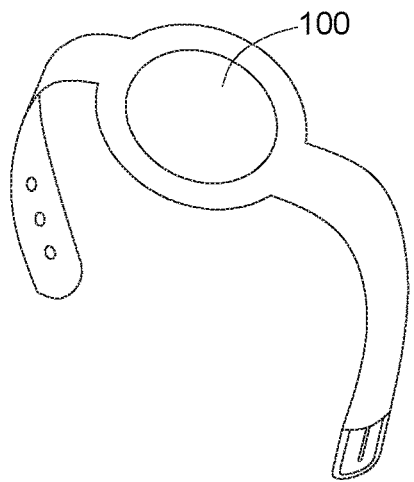
FIG. 2A shows an electronic device.

Please refer to FIG. 2A, which shows an electronic device 100. For example, the electronic device 100 may be a touch panel, a display panel, or a backlight module. The display panel can be a LCD panel, and OLED panel, a micro-LED panel, a quantum dot panel, or a multi-display panel. But the disclosure is not limited thereto. In FIG. 1, the electronic device 100 is for example a touch panel.

Figure 2B:
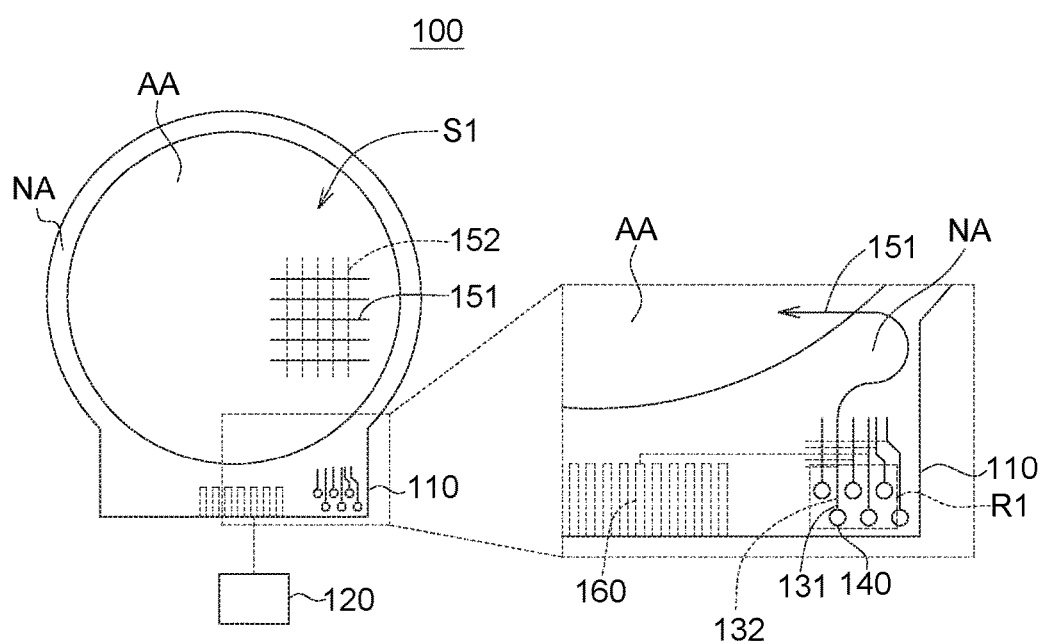
FIG. 2B shows the enlarged top view of the electronic device.

Please refer to FIG. 2B, which shows the enlarged top view of the electronic device 100. The electronic device 100 at least includes a substrate 110, a processing circuit 120, a first conductive wire 131, a second conductive wire 132, a connecting element 140, a first touch sensing wire 151, a second touch sensing wire 152 and a conductive pad 160. The substrate 110 may be a flexible substrate or a rigid substrate. The material of the flexible substrate may be, but not limited to, Polyimide (PI), Polyethylene Terephthalate (PET) or Poly Carbonate (PC). The material of the rigid substrate may be, but not limited to, glass fiber, ceramic, quartz or sapphire. The substrate 110 has a first surface S1 (shown in FIG. 3A) and a second surface S2 (shown in FIG. 3B) which is opposite to the first surface S1. Both of the first surface S1 and the second surface S2 have an active area AA and a non-active area NA. FIG. 2B illustrates the view from the first surface S1, so only the first conductive wire 131, the first touch sensing wire 151 and part of the connecting element 140 on the first surface S1 can be shown. The first conductive wire 131 and part of the connecting element 140 is located in the non-active area NA, and the first touch sensing wire 151 is located in the active area AA. The second touch sensing wire 152 and the conductive pad 160 which are located on the second surface S2 are shown by dotted line in the FIG. 2B. The second conductive wire 132 is located right behind the first conductive wire 131, so the second conductive wire 132 is not shown and only the label of the second conductive wire 132 is shown by dotted line. The connecting element 140 penetrates the substrate 110 for connecting the first conductive wire 131 and the second conductive wire 132.

The first touch sensing wire 151 and the second touch sensing wire 152 are used for sensing the touch by one object. For example, the object may be, but not limited to, a finger or a touch pen. When the touch sensing operation is performed, the processing circuit 120 outputs a driving signal to the conductive pad 160. Then, the driving signal is transmitted to the connecting element 140 via the second conductive wire 132 on the second surface S2. Next, the driving signal is transmitted to the first conductive wire 131 on the first surface S1 via the connecting element 140 which penetrates the substrate 110. Then, the driving signal is transmitted to the first touch sensing wire 151. When the second touch sensing wire 152 on the second surface S2 senses a touch signal, the touch signal is transmitted to the conductive pad 160 on the second surface S2 via the wires on the second surface S2. Then, the touch signal is transmitted to the processing circuit 120. The processing circuit 120 can obtain the touch location according to the touch signal. The exemplary example described above is just an example of the touch sensing operation and the present disclosure is not limited thereto.

That is to say, according to the arrangement of the first conductive wire 131, the connecting element 140 and the second conductive wire 132, the conductive pad 160 on the second surface S2 can receive the driving signal from the processing circuit 120, and then the driving signal can be transmitted to the first touch sensing wire 151 on the first surface S1. As such, the second touch sensing wire 152 can obtain the touch sensing signal according to the variety of the capacitance.

Figure 3A:
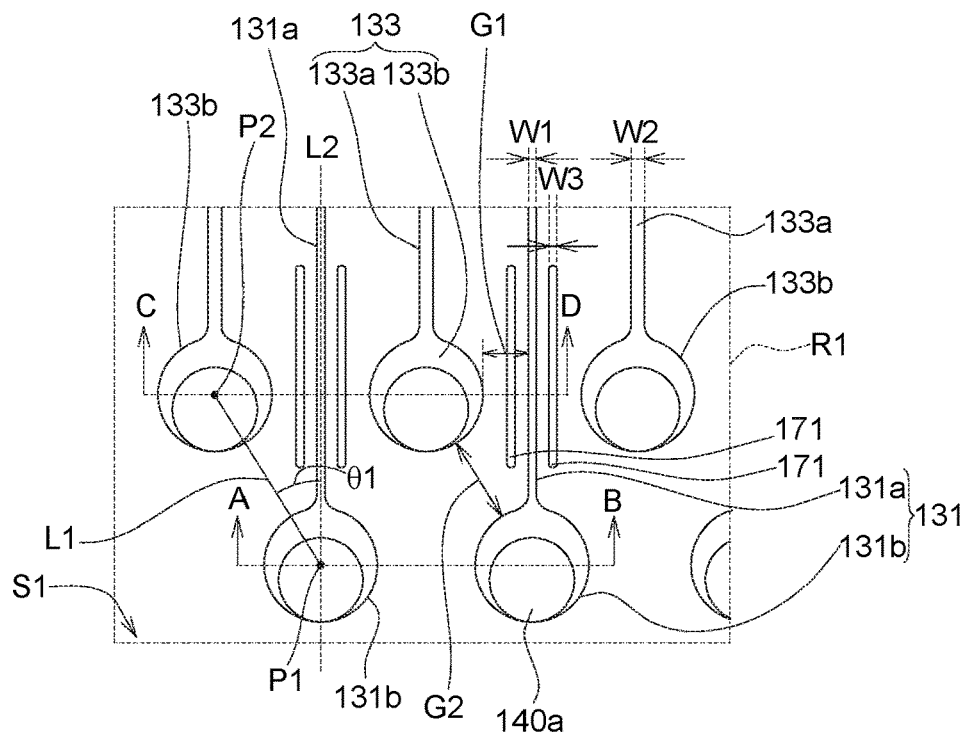
FIG. 3A illustrates an enlarged diagram of a region of FIG. 2 from view of the first surface.
Figure 3B:
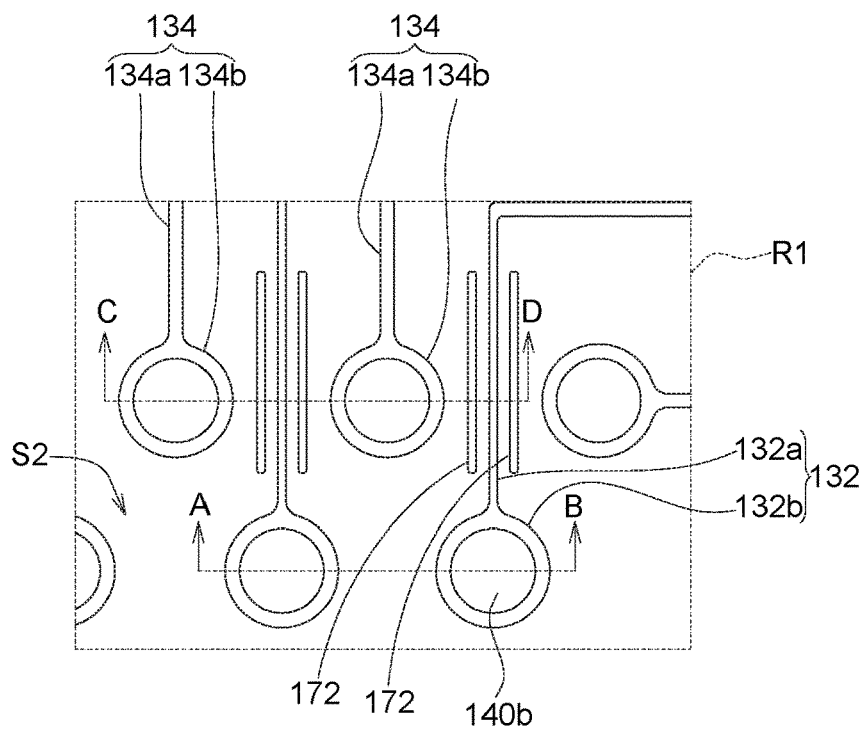
FIG. 3B illustrates an enlarged diagram of a region of FIG. 2 from view of the second surface.
Figure 5:
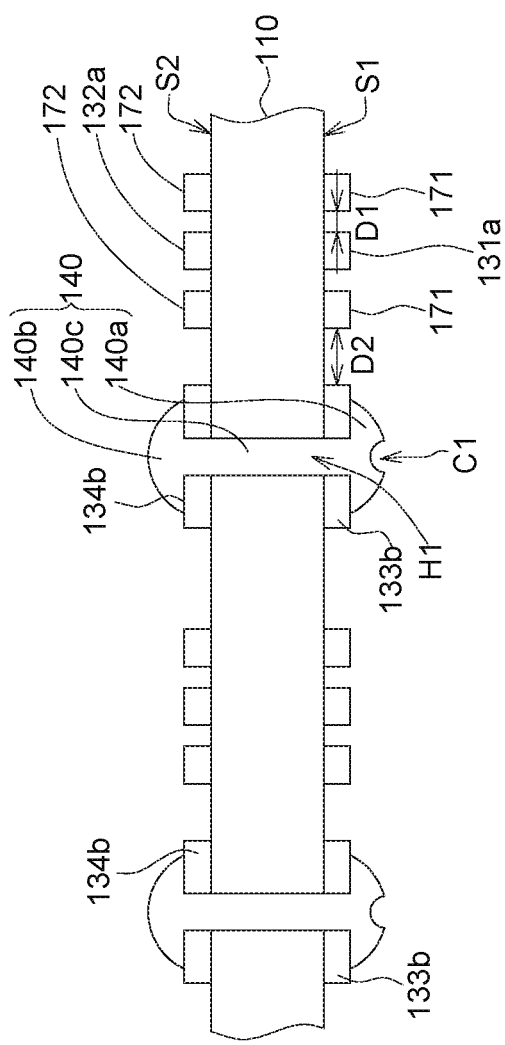
FIG. 5 shows a cross section along with the section line C-D of FIGS. 3A and 3B.

Please refer to FIGS. 3A, 3B, 4 and 5. FIG. 3A illustrates an enlarged diagram of a region R1 of FIG. 2B from view of the first surface S1. FIG. 3B illustrates an enlarged diagram of the region R1 of FIG. 2B from view of the second surface S2. FIG. 4A shows a cross section along with the section line A-B of FIGS. 3A and 3B. FIG. 5 shows a cross section along with the section line C-D of FIGS. 3A and 3B. As shown in FIG. 3A, the first conductive wire 131 on the first surface S1 includes a first wire element 131a and a first contacting element 131b. The first wire element 131a is connected to the first contacting element 131b. The material of the first wire element 131a and the first contacting element 131b may be gold, silver, copper, nickel, tin, any suitable conductive material or the combination thereof. The first conductive wire 131 may be manufactured by coat/exposure/development processes. The shape of the first wire element 131a may be an elongated strip, and the shape of the first contacting element 131b may be a circle, an oval, a rectangular, a square or a ring. However, the present disclosure is not limited to those shapes.

As shown in FIG. 3B, the second conductive wire 132 on the second surface S2 includes a second wire element 132a and a second contacting element 132b. The second wire element 132a is connected to the second contacting element 132b. The material of the second wire element 132a and the second contacting element 132b may be gold, silver, copper, nickel, tin, any suitable conductive material or the combination thereof. The second conductive wire 132 may be manufactured by coat/exposure/development processes. The shape of the second wire element 132a is may be an elongated strip, and the shape of the second contacting element 132b may be a circle, an oval, a rectangular, a square or a ring. In one embodiment, the first conductive wire 131 and the second conductive wire 132 may be manufactured by double-sides coat/exposure/development processes at the same time. In one embodiment, the first conductive wire 131 and the second conductive wire 132 may be manufactured by two steps of coat/exposure/development process at different times.

As shown in FIG. 4A, the substrate 110 has a through hole H1. The through hole H1 penetrates the substrate 110 and locates between the first surface S1 and the second surface S2. The through hole H1 may be formed before forming the first conductive wire 131 and the second conductive wire 132. Or, the through hole H1 may be formed after forming the first conductive wire 131 and the second conductive wire 132. The through hole H1 may be formed by mechanical drilling, laser drilling or chemical etching the substrate 110. The connecting element 140 includes a first portion 140a, a second portion 140b and a third portion 140c. The first portion 140a is disposed on the first surface S1 and is electrically connected to the first contacting element 131b. The second portion 140b is disposed on the second surface S2 and is electrically connected to the second contacting element 132b. The third portion 140c is disposed in the through hole H1 and connects the first portion 140a and the second portion 140b. The material of the connecting element 140 may be metal paste, metal glue or solder paste. The connecting element 140 is for example manufactured by screen printing. For example, in the screen printing process, silver paste may be printed at the location of the through hole H1 on the first surface S1. Part of the silver paste may be flowed into the through hole H1, and other part of the silver paste may be remained on the first contacting element 131b. After the part of the silver paste on the first surface S1 is cured, the cured silver paste forms the first portion 140a and part of the third portion 140c. Next, the silver paste may be printed at the location of the through hole H1 on the second surface S2. Part of the silver paste may be flowed into the through hole H1, and other part of the silver paste may be remained on the second contacting element 132b. After the part of the silver paste on the second surface S2 is cured, the cured silver paste forms the second portion 140b and part of the third portion 140c. In one embodiment, the silver paste may be filled in the through hole H1 by means of a dispensing technique, a printing technique or any known process.

As shown in FIG. 4A, because the silver paste will be flowed into the through hole H1, the first portion 140a or the second portion 140b may have a concave corresponding to the through hole H1. In the embodiment of FIG. 4A, the first portion 140a has a first concave C1 corresponding to the through hole H1. In another embodiment, as shown in FIG. 4B, the second portion 140b has a second concave C2 corresponding to the through hole H1. Or, the first portion 140a has the first concave C1 and the second portion 140b has the second concaves C2.

Because the precision of the screen printing process is lower than the coat/exposure/development process, the first portion 140a may not be accurately aligned with the first contacting element 131b, such that the first portion 140a may offset the center of the first contacting element 131b. Similarly, because the precision of manufacturing process of the through hole H1 is different from the precision of the coat/exposure/development process, the through hole H1 may not be accurately aligned with the center of the first contacting element 131b, such that the through hole H1 may offsets the center of the first contacting element 131b.

Similarly, the concave C1 may not be accurately aligned with the center of the first portion 140a, such that the concave C1 may offset the center of the first portion 140a. The first portion 140a and the second portion 140b may be partially overlapped and are not accurately aligned with each other. In the disclosure, at least a part of the first portion 140a overlaps the second portion 140b in a direction perpendicular to the first surface S1 or the second surface S2.

As shown in FIG. 3A, for making sure that the first portion 140a and the first contacting element 131b can be electrically connected with each other, a covering area of the first contacting element 131b on the first surface S1 is greater than a covering area of the first portion 140a on the first surface S1. And at least a part of the first contacting element 131b overlaps the first portion 140a in a direction perpendicular to the first surface S1. As such, even if a slightly positioning error is generated in the screen printing process of the first portion 140a, the first contacting element 131b and the first portion 140a still can be electrically connected with each other. In the disclosure, the covering area is defined as an area of an orthogonal projection of an object on a specific surface. For instance, the covering area of the first contacting element 131b on the first surface S1 is defined as the area of the orthogonal projection of the first contacting element 131b on the first surface S1.

As shown in FIG. 3B, for making sure that the second portion 140b and the second contacting element 132b can be electrically connected with each other, a covering area of the second contacting element 132b on the second surface S2 is greater than a covering area of the second portion 140b on the second surface S2. And at least a part of the second contacting element 132b overlaps the second portion 140b in a direction perpendicular to the second surface S2. As such, even if a slightly positioning error is generated in the screen printing process of the second portion 140b, the second contacting element 132b and the second portion 140 still can be electrically connected with each other.

Besides, as shown in FIG. 3A, the electronic device 100 further includes a third conductive wire 133. The third conductive wire 133 is disposed on the first surface S1. The third conductive wire 133 includes a third wire element 133a and a third contacting element 133b. The third wire element 133a is connected to the third contacting element 133b. The third conductive wire 133 and the first conductive wire 131 are used for transmitting the driving signal to the first touch sensing wire 151. In the present embodiment, the third contacting element 133b and the first wire element 131a are spaced apart by a first distance G1. The first distance G1 is the minimum distance between the third contacting element 133b and the first wire element 131a. The third contacting element 133b and the first contacting element 131b are spaced apart by a second distance G2. The second distance G2 is the minimum distance between the third contacting element 133b and the first contacting element 131b. The first distance G1 is less than or equal to the second distance G2.

In another embodiment, a line connects the center P1 of the first contacting element 131b and the center P2 of the third contacting element 133b is defined as a connecting line L1. A line starting from the center P1 of the first contacting element 131b and extending along an extending direction of the first wire element is defined as an extending line L2. An included angle θ1 is formed between the connecting line L1 and an extending line L2 of the first wire element 131a. And the included angle θ1 is less than 90 degrees. In the disclosure, the center P1 is the geometric center of the first contacting element 131b, and the center P2 is the geometric center of the third contacting element 133b.

According to the design of the first distance G1, the second distance G2 or the design of the included angle θ1, the first contacting element 131b and the third contacting element 133b are staggered and arranged in two rows. The first conductive wire 131 and the third conductive wire 133 can be arranged with high space utilization.

Moreover, the first wire element 131a is disposed between two adjacent third contacting elements 133b, and a width W1 of the first wire element 131a is less than a width W2 of the third wire element 133a. In the disclosure, the width W1 is the minimum width of the first wire element 131a, and the width W2 is the minimum width of the third wire element 133a.

Further, as shown in FIG. 3B, the electronic device 100 further includes a fourth conductive wire 134. The fourth conductive wire 134 is disposed on the second surface S2. The fourth conductive wire 134 includes a fourth wire element 134a and a fourth contacting element 134b. The fourth wire element 134a is connected to the fourth contacting element 134b. The fourth conductive wire 134 and the second conductive wire 132 are used for transmitting the driving signal from the processing circuit 120.

The relationship among the fourth contacting element 134b, the second wire element 132a and the second contacting element 132b is similar to the relationship among the third contacting element 133b, the first wire element 131a and the first contacting element 131b, and the similarities are not repeated here. The second conductive wire 132 and the fourth conductive wire 134 can be arranged with high space utilization.

Please refer to FIGS. 3A and 5. In the present embodiment, the substrate 110 is a flexible substrate, so the first wire element 131a may be bent along with the substrate 110. The substrate 110 may be bent in the manufacturing process of the electronic device 100, or be bent during the operation of the user. For preventing the break due to the bending, the electronic device 100 further includes at least one dummy pad 171. The dummy pad 171 is disposed on the first surface S1. The dummy pad 171 is disposed at one side of the first wire element 131a, and the dummy pad 171 and the first wire element 131a are electrically isolated. In this embodiment, the dummy pad 171 is not used for transmitting signal or grounding, so the dummy pad 171 is not connected to any signal source. In another embodiment, the dummy pad 171 may be connected to a signal source to be applied a predetermined voltage or a ground voltage. When the substrate 110 is bent, the dummy pad 171 disposed at one side of the first wire element 131a can share the stress applied on the first wire element 131a, such that the first wire element 131a can be prevented from break.

In the present embodiment, two dummy pads 171 are disposed at two sides of the first wire element 131a. Besides, the dummy pad 171 is disposed between the first wire element 131a and the third contacting element 133b, such that the dummy pad 171 can share the pull stress that the third contacting element 131b applied on the first wire element 131a.

Moreover, the width of the dummy pad 171 is not needed to be too large. In the present embodiment, the width W3 of the dummy pad 171 is less than or equal to the width W1 of the first wire element 131a. The width of the dummy pad 171 may be increased to increase the ability of sharing the stress. In one embodiment, the width W3 of the dummy pad 171 is greater than the width W1 of the first wire element 131a. In the disclosure, the width W3 of the dummy pad 171 is the minimum width of the dummy pad 171.

Besides, as shown in FIG. 5, the distance D1 between the dummy pad 171 and the first wire element 131a is less than the distance D2 between the dummy pad 171 and the third contacting element 133b. That is to say, the dummy pad 171 is disposed near to the first wire element 131a, such that the stress applied on the first wire element 131a can be successfully shared. In the disclosure, the distance D1 is the minimum distance between the dummy pad 171 and the first wire element 131a, and the distance D2 is the minimum distance between the dummy pad 171 and the third contacting element 133b.

Moreover, please refer to FIGS. 3B and 5. The electronic device 100 further includes at least one dummy pad 172. The dummy pad 172 is disposed on the second surface S2. The dummy pad 172 is disposed at one side of the second wire element 132a. The dummy pad 172 and the second wire element 132a are electrically isolated. The relationship among the dummy pad 172, the second conductive wire 132 and the fourth conductive wire 134 is similar to the relationship among the dummy pad 171, the first conductive wire 131 and the third conductive wire 133, and the similarities are not repeated here. That is to say, when the substrate 110 is bent, the dummy pad 172 disposed on the second surface S2 can share the stress applied on the second wire element 132a, such that the second wire element 132a can be prevent from break.

Figure 6A:
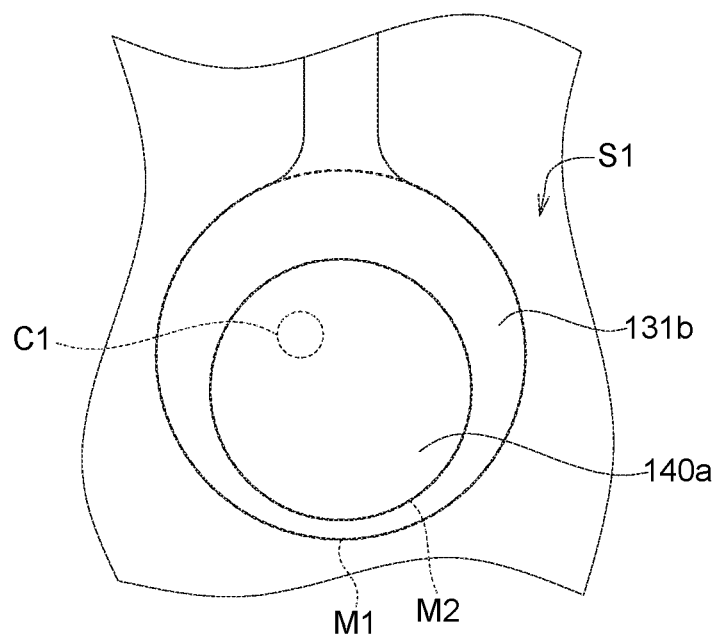
FIG. 6A shows an enlarged diagram of the first contacting element and the first portion on the first surface.
Figure 6B:
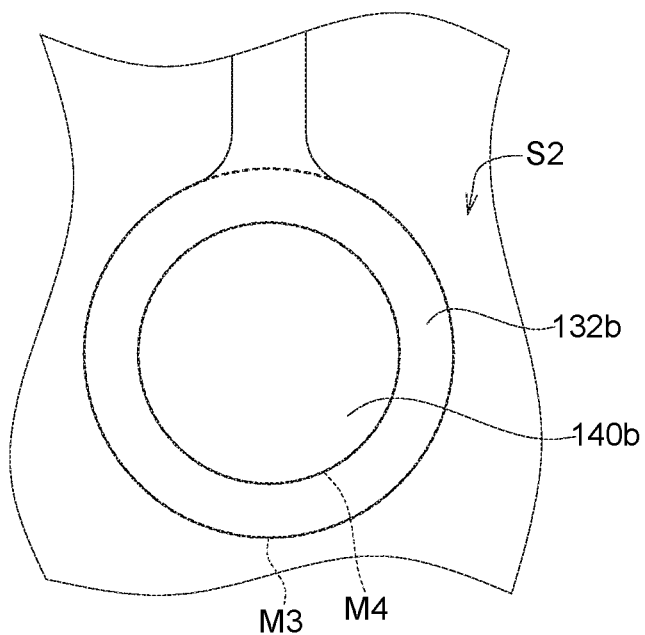
FIG. 6B shows an enlarged diagram of the second contacting element and the second portion on the second surface.

Please refer to FIGS. 6A and 6B. FIG. 6A shows an enlarged diagram of the first contacting element 131b and the first portion 140a on the first surface S1. FIG. 6B shows an enlarged diagram of the second contacting element 132b and the second portion 140b on the second surface S2. As shown in FIG. 6A, a projection of the first contacting element 131b on the first surface S1 is defined as a first contacting pattern M1. A projection of the first portion 140a on the first surface S1 is defined as a first connecting pattern M2. In detail, the first contacting pattern M1 and the first connecting pattern M2 are respectively formed by orthogonally projecting the first contacting element 131b and the first portion 140a on the first surface S1. The precision of the screen printing process is lower than the precision of the coat/exposure/development process, so the first portion 140a may not be accurately aligned with the first contacting element 131b. Therefore, the first contacting pattern M1 overlaps the first connecting pattern M2 in a direction perpendicular to the first surface S1 or the second surface S2. For making sure that the first portion 140a and the first contacting element 131b are electrically connected with each other, the area of the first contacting pattern M1 is greater than the area of the first connecting pattern M2. As such, even if a slightly positioning error is generated in the screen printing process of the first portion 140a, the first contacting element 131b and the first portion 140a can be electrically connected with each other.

As shown in FIG. 6B, a projection of the second contacting element 132b on the second surface S2 is defined as a second contacting pattern M3. A projection of the second portion 140b on the second surface S2 is defined as a second connecting pattern M4. In detail, the second contacting pattern M3 and the second connecting pattern M4 are respectively formed by orthogonally projecting the second contacting element 132b and the second portion 140b on the second surface S2. The precision of the screen printing process is lower than the precision of the coat/exposure/development process, so the second portion 140b may not be accurately aligned with the second contacting element 132b. Therefore, the second contacting pattern M3 and the second connecting pattern M4 may be partially overlapped with each other. For making sure that the second portion 140b and the second contacting element 132b are electrically connected with other, the area of the second contacting pattern M3 is greater than the area of the second connecting pattern M4. As such, even if a slightly positioning error is generated in the screen printing process of the second portion 140b, the second contacting element 132b and the second portion 140b can be electrically connected with each other.

In the embodiments described above, the touch sensing circuits are disposed at two sides of the substrate. However, the disclosure can be applied to any substrate having any circuits disposed at two sides which are needed to be connected with each other.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a substrate having a first surface and a second surface opposite to the first surface, wherein the substrate has a through hole located between the first surface and the second surface;
   a connecting element, wherein the connecting element includes a first portion, a second portion and a third portion, the first portion is disposed on the first surface, the second portion is disposed on the second surface, and the third portion is disposed in the through hole and connects the first portion and the second portion;
   a first contacting element disposed on the first surface; and
   a second contacting element disposed on the second surface;
   wherein the first contacting element electrically connects the second contacting element through the connecting element,
   wherein a covering area of the first contacting element on the first surface is greater than a covering area of the first portion on the first surface, and at least a part of the first contacting element overlaps the first portion in a direction perpendicular to the first surface.

2. The electronic device according to claim 1, wherein a covering area of the second contacting element on the second surface is greater than a covering area of the second portion on the second surface, and at least a part of the second contacting element overlaps the second portion in a direction perpendicular to the second surface.

3. The electronic device according to claim 1, further comprising:
   a first wire element disposed on the first surface, wherein the first wire element is connected to the first contacting element;
   a second wire element disposed on the second surface, wherein the second wire element is connected to the second contacting element;
   a third contacting element disposed on the first surface; and
   a third wire element disposed on the first surface, wherein the third wire element is connected to the third contacting element, the third contacting element and the first wire element are spaced apart by a first distance, the third contacting element and the first contacting element are spaced apart by a second distance, and the first distance is less than or equal to the second distance.

4. The electronic device according to claim 3, wherein a line connects a center of the first contacting element and a center of the third contacting element is defined as a connecting line, a line starting from the center of the first contacting element and extending along an extending direction of the first wire element is defined as an extending line, and an included angle between the connecting line and the extending line is less than 90 degrees.

5. The electronic device according to claim 3, further comprising:
a dummy pad disposed on the first surface, wherein the dummy pad is disposed at one side of the first wire element, and the dummy pad and the first wire element are electrically isolated.

6. The electronic device according to claim 5, wherein the dummy pad is disposed between the first wire element and the third contacting element.

7. The electronic device according to claim 5, wherein a distance between the dummy pad and the first wire element is less than a distance between the dummy pad and the third contacting element.

8. The electronic device according to claim 5, wherein a width of the dummy pad is less than or equal to a width of the first wire element.

9. The electronic device according to claim 5, wherein a width of the first wire element is less than a width of the third wire element.

10. The electronic device according to claim 1, wherein the first portion has a first concave corresponding to the through hole.

11. The electronic device according to claim 1, wherein the second portion has a second concave corresponding to the through hole.

12. The electronic device according to claim 1, wherein at least a part of the first portion overlaps the second portion in a direction perpendicular to the first surface.

13. The electronic device according to claim 1,
wherein the connecting element includes a first portion, a second portion and a third portion, the first portion is disposed on the first surface, the second portion is disposed on the second surface, the third portion is disposed in the through hole and connects the first portion and the second portion, and a projection of the first portion on the first surface is defined as a first connecting pattern;
wherein a projection of the first contacting element on the first surface is defined as a first contacting pattern;
wherein an area of the first contacting pattern is greater than an area of the first connecting pattern, and at least a part of the first contacting pattern overlaps the first connecting pattern in a direction perpendicular to the first surface.

14. The electronic device according to claim 1, wherein the connecting element has a third surface protruded from the first surface of the substrate, and the connecting element has a fourth surface protruded from the second surface of the substrate.

15. The electronic device according to claim 14, wherein the first contacting element outwardly disposes on the third surface of the connecting element, and the second contacting element outwardly disposes on the fourth surface of the connecting element.

* * * * *